United States Patent
Im et al.

(10) Patent No.: US 7,310,273 B2
(45) Date of Patent: Dec. 18, 2007

(54) METHOD FOR CONTROLLING PRECHARGE TIMING OF MEMORY DEVICE AND APPARATUS THEREOF

(75) Inventors: Jae Hyuk Im, Kyoungki-do (KR); Kang Seol Lee, Seoul (KR)

(73) Assignee: Hynix Semiconductor Inc., Kyoungki-do (KR)

(*) Notice: Subject to any disclaimer, the term of this patent is extended or adjusted under 35 U.S.C. 154(b) by 31 days.

(21) Appl. No.: 11/108,494

(22) Filed: Apr. 18, 2005

(65) Prior Publication Data
US 2006/0140032 A1    Jun. 29, 2006

(30) Foreign Application Priority Data
Dec. 28, 2004    (KR) .................. 10-2004-0113629

(51) Int. Cl.
*G11C 11/34*    (2006.01)
(52) U.S. Cl. .................. 365/189.01; 365/203
(58) Field of Classification Search ........... 365/189.01, 365/203
See application file for complete search history.

(56) References Cited

U.S. PATENT DOCUMENTS

2005/0099876 A1*    5/2005    Ayukawa et al. ...... 365/230.05
2005/0146919 A1*    7/2005    Ellis et al. .................. 365/149

FOREIGN PATENT DOCUMENTS

| KR | 1020030050181 | 6/2003 |
| KR | 10-2004 0093986 | 11/2004 |
| KR | 1020040093986 | 11/2004 |
| KR | 1020050101872 | 10/2005 |

* cited by examiner

*Primary Examiner*—Michael T Tran
(74) *Attorney, Agent, or Firm*—Ladas & Parry LLP

(57) ABSTRACT

A method for controlling a precharge timing of a memory device is disclosed. The method includes making timing of generation of a signal for determining a precharge timing in a normal operation and a signal for determining a precharge timing in a refresh operation different from each other by making timing of generation of a signal for controlling the normal operation and a signal for controlling the refresh operation different from each other.

6 Claims, 9 Drawing Sheets

METHOD FOR CONTROLLING PRECHARGE TIMING OF MEMORY DEVICE AND APPARATUS THEREOF

BACKGROUND OF THE INVENTION

1. Field of the Invention

The present invention relates to a method for controlling a precharge timing of a memory device and an apparatus thereof, and more particularly to a method for controlling a precharge timing of a memory device and an apparatus thereof that can make the precharge timing of a bit line performed after a normal operation of the memory device and the precharge timing of the bit line after a refresh operation different from each other.

2. Description of the Prior Art

Generally, a volatile memory device (hereinafter referred to as a "memory device") has three operation modes: a mode for storing data in memory cells (i.e., write mode), a mode for reading out the data from the memory cells (i.e., read mode) and a mode for restoring the data (i.e., refresh mode) at predetermined intervals so as to prevent the stored data from vanishing.

In performing such operation modes, each memory cell is composed of a cell transistor and a cell capacitor. By turning on a word line connected to a gate of the cell transistor, the data stored in the cell capacitor is read out through a bit line (in the read mode) or the data written from an outside is stored in the cell capacitor through the bit line (in the write mode).

In order to perform the above-described read operation, write operation and refresh operation, the cell transistor should be turned on by enabling the word line. This operation is called an active operation and an active command is a signal used for the active operation.

If the active command is applied, the cell transistor is turned on and the memory cell and a bit-line sense amplifier are connected with each other through the bit line.

If the word line is shifted to a high-level state by the active command, a charge sharing occurs between the memory cell and the bit line and the existing data is restored in the memory cell by the operation of the bit-line sense amplifier. After the data is restored in the memory cell, a precharge command is applied. This precharge command shifts the word line to a low-level state and precharges the bit line.

Meanwhile, in order to restore the existing data, the word line should be kept at a high level for a predetermined time and this time for which the word line is kept at a high level is called "tRAS." In other words, the word line should be kept at a high level at least for the time tRAS after the active command is applied in order to stably perform the restore operation.

Figure 1:
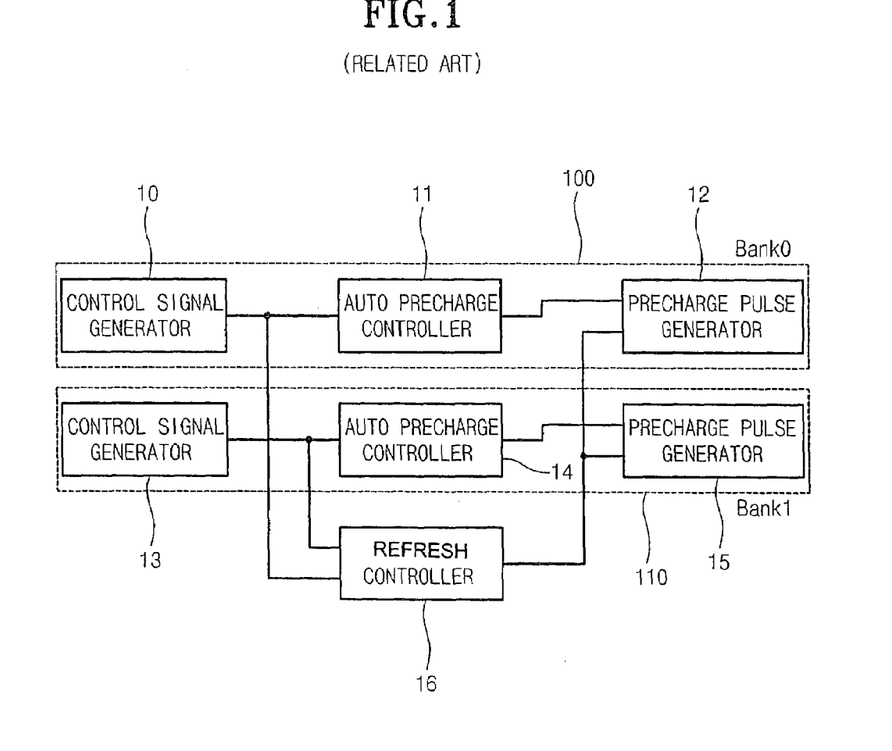
FIG. 1 is a view explaining a conventional method of performing a precharge operation in a memory device.

FIG. 1 is a view explaining a conventional method of performing a precharge operation in a memory device.

Referring to FIG. 1, a bank 100 includes a control signal generator 10, an auto precharge controller 11 and a precharge pulse generator 12, and a bank 110 includes a control signal generator 13, an auto precharge pulse generator 14 and a precharge pulse generator 15.

In FIG. 1, the auto precharge controllers 11 and 14 function to enable an auto precharge operation just after a read or write operation, and a refresh controller 16 functions to enable the precharge operation just after a self-refresh or auto-refresh operation. Although only two banks are illustrated in FIG. 1, four banks may be provided in the same manner.

Hereinafter, the operation of the circuit block of FIG. 1 will be explained in more detail.

Figure 2A:
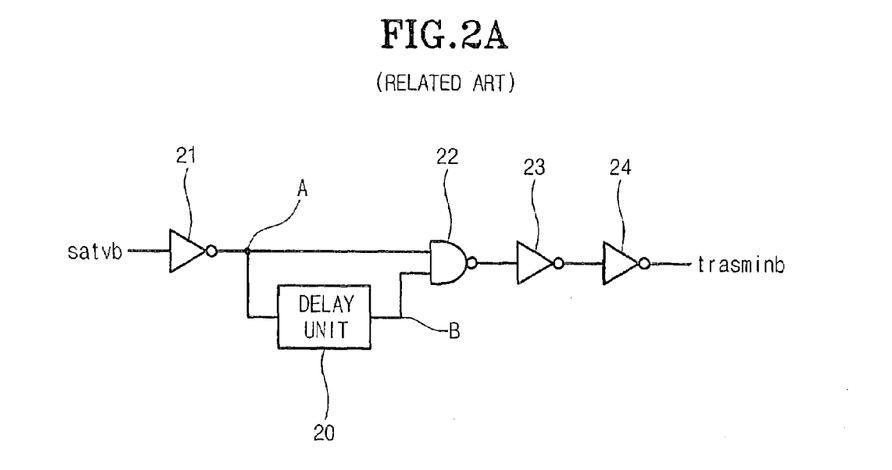
FIG. 2a is a view illustrating an example of the control signal generator of FIG. 1.

The control signal generators 10 and 13 receive an input signal satvb that is a pulse signal, and generate a pulse signal trasminb that is a pulse signal (See FIG. 2a). Here, the control signal trasminb is a signal that is enabled as a low-level signal when a predetermined time elapses after a signal for activating the word line is applied. The control signal keeps the word line in an active state for the predetermined time tRAS, and then secures the time until the word line is turned off.

The auto precharge controllers 11 and 14, if the cause of the enabling of the word line is a normal operation such as a read with an auto precharge, a write with an auto precharge, etc., generate a precharge command when the control signal trasminb is shifted to a high-level state after the time tRAS. Here, the "read with an auto precharge" is a command for automatically precharging the bit line after the read operation, and the "write with an auto precharge" is a command for automatically precharging the bit line after the write operation.

The refresh controller 16, if the cause of the enabling of the word line is the auto refresh or self refresh operation, generates a precharge command when the control signal trasminb is shifted to a high-level state after the time tRAS.

The precharge pulse generators 12 and 15 receive output signal of the auto precharge controllers 11 and 14 and the refresh controller 16, the precharge command, etc., and generate an internal pulse for performing the precharge.

FIG. 2a is a view illustrating an example of the control signal generator of FIG. 1.

As illustrated in FIG. 2a, the control signal generator includes an inverter 21 for receiving a signal satvb, a delay unit 20 for receiving an output signal of the inverter 21, a NAND gate 22 for receiving an output signal of the delay unit 20 and the output signal of the inverter 21, and inverters 23 and 24 for driving an output signal of the NAND gate 22. The output signal of the inverter 24 is "trasminb."

Figure 10:
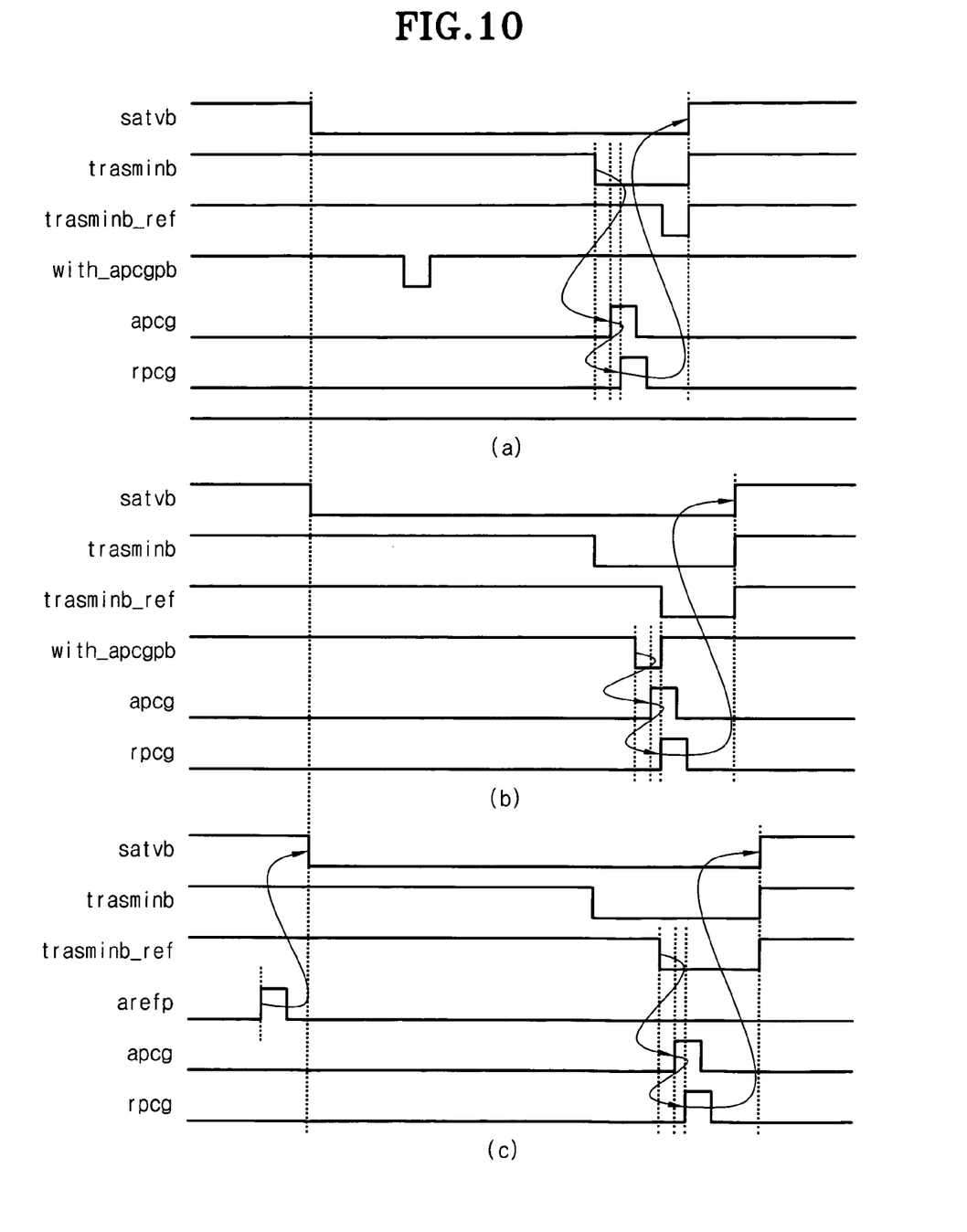
FIGS. 10a to 10c are waveform diagrams of signals according to operation modes according to embodiments of the present invention.

In FIG. 2a, the term "satvb" denotes a signal that is shifted from a high-level state to a low-level state if a signal for indicating an active operation is applied, and then shifted to a high-level state if a signal for indicating a precharge operation is applied (See FIGS. 10a to 10c).

Figure 2B:
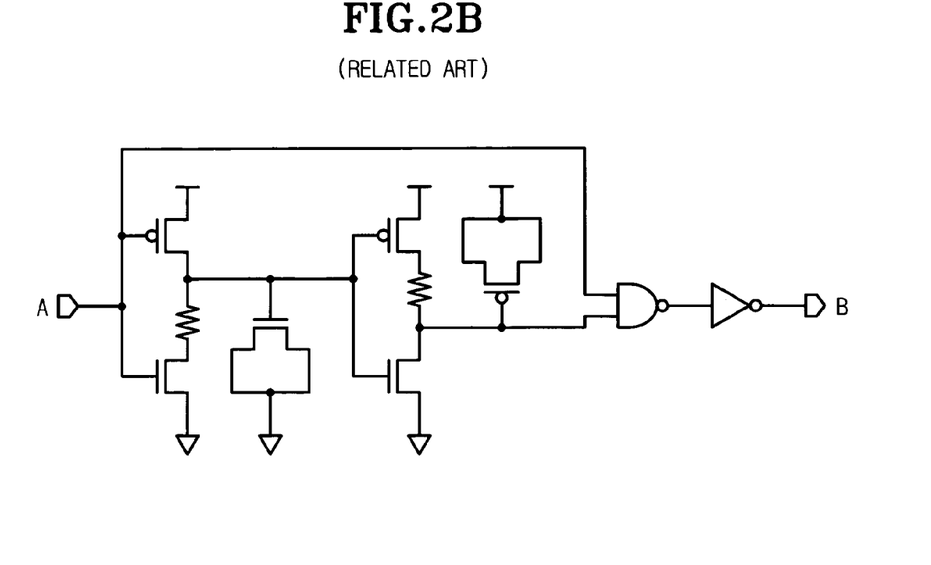

FIG. 2b is a view illustrating an example of the delay unit 20 of the control signal generator illustrated in FIG. 2a. It can be recognized that the delay unit illustrated in FIG. 2b is not a general delay unit having an inverter chain.

The reason why the delay unit as illustrated in FIG. 2b is used is that a node A is shifted to a high-level state if the input signal satvb of the control signal generator is shifted to a low-level state. If the node A is shifted to a high-level state, a time period as much as tRAS, which is relatively greater than that obtained by the inverter chain, can be provided. Additionally, if the signal satvb is shifted to a high-level state by the precharge command, the node A is shifted to a low-level state. If the node A is shifted to a low-level state, a node B is shifted to a low-level state in a short time. Accordingly, the output signal trasminb can be shifted to a high-level state in a short time.

Figure 3:
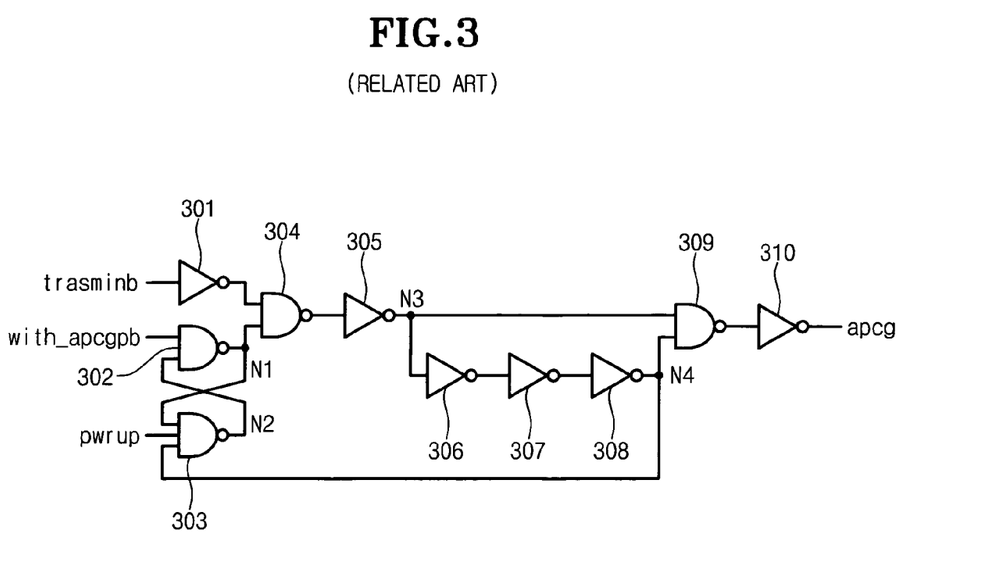
FIG. 3 is a view illustrating an example of the auto precharge controller illustrated in FIG. 1.

FIG. 3 is a view illustrating an example of an auto precharge controller illustrated in FIG. 1. This auto precharge controller generates the signal trasminb generated from the control signal generator and the precharge command apcg for the auto precharge operation.

The circuit of FIG. 3 includes an inverter 301 for receiving a signal pwrup, latch units 302 and 303, AND means 304 and 305, delay units 306 to 308 and AND means 309 and

310. As illustrated in FIG. 3, the AND means 304 and 305 receive an output signal of the inverter 301 and output signals of the latch units 302 and 303. The delay units 306 to 308 receive output signals of the AND means 304 and 305. The AND means 309 and 310 receive output signals of the delay units 306 to 308 and the output signals of the AND means 304 and 305, and output the signal apcg.

In FIG. 3, the term "with_apcgpb" denotes a signal for generating a low-level pulse when the command that requires the auto precharge operation such as the read with an auto precharge or the write with an auto precharge is applied from the outside (See FIGS. 10*a* to 10*c*). The term "pwrup" denotes a signal for setting an initial value of the memory device when the power is applied to the memory device. The signal pwrup is initially at a low level, but is fixed to a high level after a predetermined time elapses.

The operation of the circuit of FIG. 3 will now be explained.

Initially, the signal pwrup is at a low level, and thus a node N2 becomes high. If the read with an auto precharge or write with an auto precharge command is not applied, the signal with_apcgpb is at a high level, and thus a node N1 is kept at a low level. Additionally, if the word line is not activated, the signal trasminb is at a low level and the node N1 is also at a low level, a node N3 becomes low. Consequently, the node N4 is at a high level and the signal apcg is at a low level. If the power supply voltage goes over a predetermined level as the predetermined time elapses, the signal pwrup is shifted to a high-level state.

The circuit of FIG. 3 operates in a different manner according to the timing of the generation of the signal with_apcgpb, which will now be explained in detail.

First, if the read with an auto precharge or write with auto precharge command is applied before the time tRAS elapses after the active command is applied (See FIG. 10*a*), the circuit operates as follows.

When the active command is applied, the signal trasminb is at a high level (As described above, the signal trasminb become low after a predetermined time elapses after the active command). In this case, the node N3 becomes low and the node N4 becomes high irrespective of the state of the node N1. Accordingly, the signal apcg is kept at a low level and thus the precharge is not performed. That is, even if the precharge signal is applied by the read with an auto precharge or write with an auto precharge command (that is, even if the signal with_apcgpb causes a low-level pulse to be produced), the signal apcg is not enabled until the signal trasminb become low.

If the signal trasminb is shifted to a low-level state as the time goes by, the node N3 is shifted to a high-level state. At this time, since the node N4 is still at a high level, a signal having a pulse width corresponding to the delay time through the delay units 306, 307 and 308 is outputted. Accordingly, the precharge operation is performed. That is, if the timing when the signal with_apcgpb is applied is earlier than the timing when the signal trasminb is shifted to a low-level state, the precharge signal is not outputted irrespective of the applying of the signal with_apcgpb. In this case, the precharge operation is performed after the data is restored in the memory cells by the signal trasminb.

Second, if the read with an auto precharge or write with auto precharge command is applied after the time tRAS elapses after the active command is applied (See FIG. 10*a*), the circuit operates as follows.

As described above, when the active command is applied, the signal trasminb is shifted to a high-level state. Then, the node N3 becomes low and the node N4 becomes high irrespective of the state of the node N1. Accordingly, the signal apcg is kept at a low level and thus the precharge is not performed. Meanwhile, if the signal trasminb is first shifted to a low-level state in a state in which the read with an auto precharge or write with an auto precharge command is not applied (that is, in a state in which the signal with_apcgpb does not cause a low-level pulse to be produced), the node N1 is at a low level at that time, and thus there is no change in logic level of the nodes N3 and N4. Accordingly, the signal apcg is kept at a low level. Thereafter, if the low-level pulse with_apcgpb is generated when a predetermined time elapses after the signal trasminb is shifted to the low-level state, the node N1 is shifted to a high-level state. Accordingly, the node N3 is shifted to a high-level state and outputs the high-level pulse apcg to perform the precharge operation. That is, if the read with an auto precharge or write with an auto precharge command can supplement the time tRAS, the precharge operation is not performed just after the time tRAS, but is performed when an internal signal that makes the auto precharge possible is applied.

Figure 4:
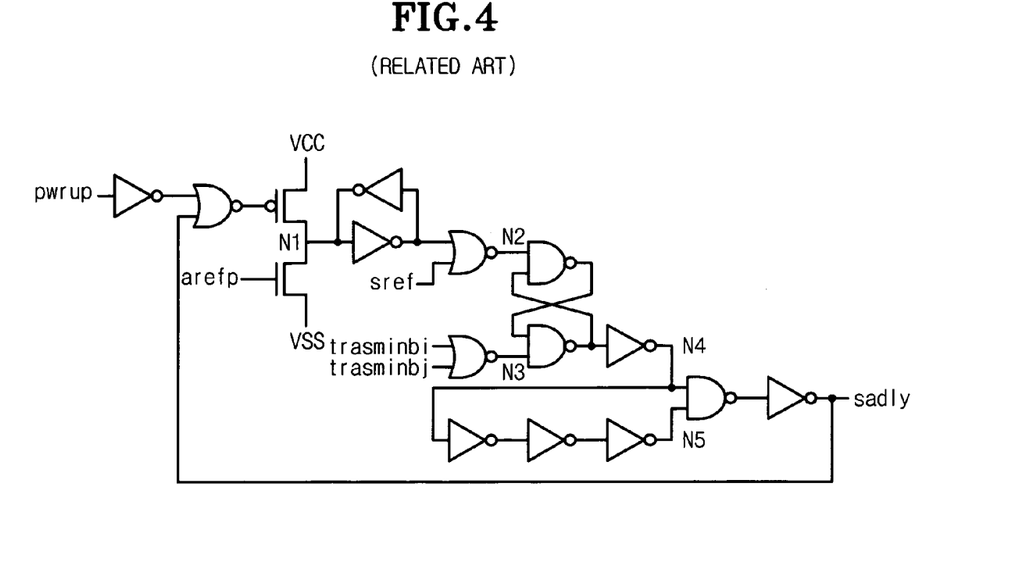
FIG. 4 is a view illustrating an example of the refresh controller illustrated in FIG. 1.

FIG. 4 is a view illustrating an example of the refresh controller illustrated in FIG. 1.

In FIG. 4, the term "arefp" denotes a signal that becomes a high-level pulse when it is required to restore the data in the memory cell after a predetermined time elapses in a normal operation. The term "sref" denotes a signal that indicates the entry into a self refresh mode, and become a high-level signal in the self refresh mode. The term "trasminbi" denotes a signal used in the i-th bank, and the term "trasminbj" denotes a signal used in the j-th bank. In the refresh mode such as a self refresh or auto refresh mode, all banks are simultaneously refreshed, and thus it can be recognized that if the signals trasminbi and trasminbj are simultaneously enabled, the present mode is the refresh mode.

The operation of the circuit of FIG. 4 will now be explained.

If the power is initially applied, the signal pwrup is kept at a low level, and thus the initial value of the node N1 becomes high. For reference, in a normal operation mode that is not the refresh mode, the signals arefp and sref are all at a low level, and thus the node N2 is at a low level.

The circuit of FIG. 4 operates in an auto refresh mode (i.e., the signal arefp is at a high level) and in a self refresh mode (i.e., the signal serf is at a high level).

In the auto refresh mode, the signal arefp becomes high. Accordingly, the node N1 becomes low and the node N2 also becomes low. Before the refresh operation is actually performed, the signals trasmini and trasminj are at a low level, and thus the node N3 becomes high. Accordingly, the node N4 becomes high, and an output signal sadly becomes low. As illustrated in FIG. 4, the low-level output signal sadly is fed back and turns off a PMOS transistor. Then, if the refresh operation is performed, the signals trasmini and trasminj become high. Accordingly, the node N3 becomes low and the node N4 also becomes low. The output signal sadly is kept at a low level irrespective of the logic level of the node N4. If the time tRAS elapses after all the banks are refreshed, all the signals trasmini and trasminj become low. Accordingly, the output signal sadly becomes a high pulse having a width corresponding to the delay time between the node N4 and the node N5. The high-level pulse output signal sadly turns on the PMOS transistor. Accordingly, the node N1 is shifted to a high-level state. The above-described process is repeated whenever the auto refresh operation is performed due to the high-level signal arefp.

Meanwhile, in the self refresh mode, the signal serf becomes high. In the self refresh mode, the node N2 is always at a low level irrespective of the logic level of the signal arefp. Accordingly, the output signal sadly becomes a high-level pulse whenever the signals trasmini and trasminj go from a high level to a low level.

Up to now, the construction and operation of the control signal generator, auto precharge controller and refresh controller as illustrated in FIG. 1 have been described.

Figure 5:
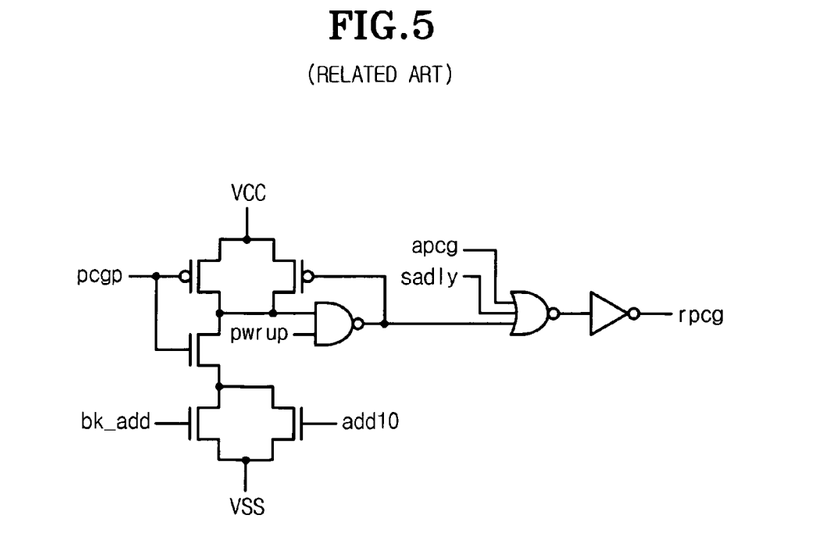
FIG. 5 is a view illustrating an example of the precharge pulse generator illustrated in FIG. 1.

FIG. 5 is a view illustrating an example of the precharge pulse generator illustrated in FIG. 1.

Referring to FIG. 5, a signal pcgp is a pulse signal that is applied as a high-level pulse when a compulsory precharge input is applied from the outside. A signal bk_add is a signal that indicates a bank address, and becomes high when the bank subject to precharge is designated. A signal add10 is the $10^{th}$ address signal input from the outside. A signal rpcg is a signal for actually effecting the precharge operation by combining all cases for the precharge operation.

The operation of the circuit of FIG. 5 will be explained.

If the precharge command is applied from the outside, the signal pcgp becomes a high-level pulse. Additionally, if the address of the bank subject to precharge is applied, the signal bk_add becomes high, and if the address add10 is at a low level, the precharge operation is performed only for the corresponding bank. That is, the output of the NAND gate is at a low level by the signal pcgp in a normal operation state, and becomes high by the precharge command. Accordingly, the output signal rpcg becomes high to perform the precharge operation.

If the signal add10 is at a high level, even a bank that is not selected from the outside is precharged. In this case, all the banks are precharged.

If the precharge command is not applied from the outside, the output of the NAND gate becomes low. In this case, if the read with an auto precharge or write with an auto precharge is applied, the signal apcg becomes high. Accordingly, the output signal rpcg becomes a high-level pulse. Additionally, in the case of the precharge by the refresh, the signal sadly is at a high level, and thus the output signal rpcg becomes a high-level pulse. Accordingly, the output signal rpcg becomes a high-level pulse to perform the refresh operation.

According to the conventional circuits as described above, it can be recognized that the signal trasminb is applied in the same manner with respect to the auto precharge and the precharge by the refresh.

Although only one bank is precharged in the case of the auto precharge, however, all the banks are simultaneously precharged in the case of the precharge by the refresh. Due to this, the power becomes insufficient in the case of the precharge by the refresh, and thus a still longer time is required in restoring the data in the memory cells in the precharge operation by the refresh.

SUMMARY OF THE INVENTION

Accordingly, the present invention has been made to solve the above-mentioned problems occurring in the prior art, and an object of the present invention is to provide a control signal generator that makes timing of generation of a control signal used in a normal operation and a control signal used in a refresh operation different from each other.

In a first embodiment of the present invention, there is provided a method for controlling a precharge timing of a memory device, comprising the step of making timing of generation of a signal for determining a precharge timing in a normal operation and a signal for determining a precharge timing in a refresh operation different from each other by making timing of generation of a signal for controlling the normal operation and a signal for controlling the refresh operation different from each other.

In the first embodiment of the present invention, the normal operation includes operations performed by means of a read with an auto precharge command and a write with an auto precharge command, and the refresh operation includes self-refresh and auto-refresh operations.

In a second embodiment of the present invention, there is provided a method for controlling a precharge timing of a memory device comprising the steps of generating first and second pulse signals for controlling a precharge operation, receiving the first pulse signal and generating a third pulse signal in a normal operation while receiving the second pulse signal and generating a fourth pulse signal in a refresh operation, and receiving the third and fourth pulse signals and outputting a precharge signal for controlling a precharge timing of the memory device.

In the second embodiment of the present invention, it is preferable that timing of generation of the first and second pulse signals and pulse widths of the first and second pulse signals are determined to be different from each other, respectively. It is also preferable that the first and second pulse signals are enabled after an active command is generated, and disabled after the precharge signal is generated.

In the second embodiment of the present invention, if a precharge mode signal for performing an operation by means of a read with an auto precharge command or a write with an auto precharge command is enabled earlier than the first pulse signal in the normal operation, the third pulse signal is enabled in response to the first pulse signal only, while if a precharge mode signal for performing a read with an auto precharge operation or a write with an auto precharge operation is generated after the first pulse signal is enabled in the normal operation, the third pulse signal is enabled in response to the precharge signal only.

In a third embodiment of the present invention, there is provided an apparatus for controlling a precharge timing of a memory device, comprising a control signal generator for generating first and second pulse signals for controlling a precharge operation, an auto precharge controller for receiving the first signal and operating in a normal operation, a refresh controller for receiving the second signal and operating in a refresh operation, and a precharge pulse generator for outputting a signal for determining a precharge timing of the memory device in response to an output signal of the auto precharge controller or an output signal of the refresh controller.

In the third embodiment of the present invention, it is preferable that timing of generation of the first and second pulse signals and pulse widths of the first and second pulse signals are determined to be different from each other, respectively.

In the third embodiment of the present invention, the control signal generator, the auto precharge controller and the precharge pulse generator are provided for each bank of the memory device, and the refresh controller is commonly used in all banks of the memory device.

In the third embodiment of the present invention, the normal operation includes operations performed by means of a read with an auto precharge command and a write with an auto precharge command, and the refresh operation includes self-refresh and auto-refresh operations.

In the third embodiment of the present invention, the control signal generator includes first and second delay units having delay times different from each other, and first and second decoding units for decoding output signals of the first and second delay units, respectively. The control signal generator receives an initial operation signal that is enabled by an active command, the initial operation signal is output as the first pulse signal through the first delay unit and the first decoding unit, and the initial operation signal is output as the second pulse signal through the second delay unit and the second decoding unit. Here, the initial operation signal is disabled in response to the output signal of the precharge pulse generator.

BRIEF DESCRIPTION OF THE DRAWINGS

The above and other objects, features and advantages of the present invention will be more apparent from the following detailed description taken in conjunction with the accompanying drawings, in which:

FIG. 2b is a view illustrating the delay unit of the control signal generator of FIG. 2a;

DETAILED DESCRIPTION OF THE PREFERRED EMBODIMENTS

Hereinafter, preferred embodiments of the present invention will be described with reference to the accompanying drawings. In the following description and drawings, the same reference numerals are used to designate the same or similar components, and so repetition of the description on the same or similar components will be omitted.

Figure 6:
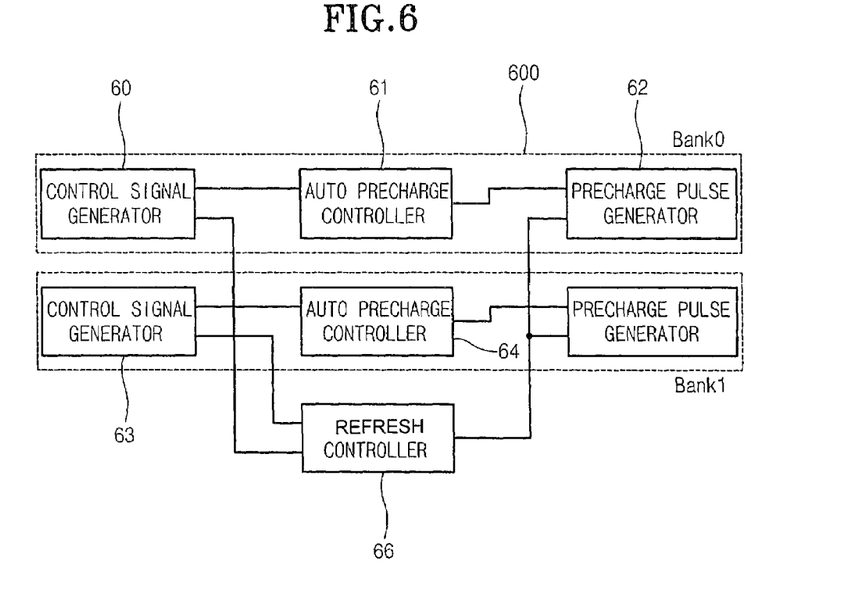
FIG. 6 is a view explaining a method of performing a precharge operation according to the present invention.

FIG. 6 is a view explaining a method of performing a precharge operation according to the present invention.

Referring to FIG. 6, a bank 600 includes a control signal generator 60, an auto precharge controller 61 and a precharge pulse generator 62, and a bank 610 includes a control signal generator 63, an auto precharge pulse generator 64 and a precharge pulse generator 65.

In FIG. 6, the auto precharge controllers 61 and 64 function to enable an auto precharge operation just after a read or write operation, and a refresh controller 66 functions to enable the precharge operation just after a self-refresh or auto-refresh operation. Although only two banks are illustrated in FIG. 6, four banks may be provided in the same manner.

As illustrated in FIG. 6, one of two output signals of the control signal generator 60 is applied to the auto precharge controller 61, and the other of the output signals is applied to the refresh controller 66. Also, one of two output signals of the control signal generator 63 is applied to the auto precharge controller 64, and the other of the output signals is applied to the refresh controller 66. An output signal of the auto precharge controller 61 is applied to the precharge pulse generator 62, and an output signal of the auto precharge controller 64 is applied to the precharge pulse generator 65. An output signal of the refresh controller 66 is applied to all the precharge pulse generators 64 and 65.

The construction and operation of the auto precharge controllers 61 and 64, refresh controller 66 and precharge pulse generators 62 and 65 are the same as those as explained with reference to FIG. 1, repeated explanations thereof will be omitted.

Since the main feature of the present invention refers to the control signal generators 60 and 63, their construction and operation will now be explained in detail.

As illustrated in FIG. 6, each control signal generator according to the present invention generates two output signals. As will be explained later, one of the two output signals is applied to the auto precharge controller and controls an auto precharge timing that is involved in the components in the same manner as the conventional circuits.

The other of the two output signals is applied to the refresh controller. By setting the width of the signal applied to the refresh controller to that wider than the signal trasminb applied to the auto precharge controller, the precharge time in the refresh mode can independently be adjusted. Accordingly, a sufficient data restore time can be secured.

Figure 7A:
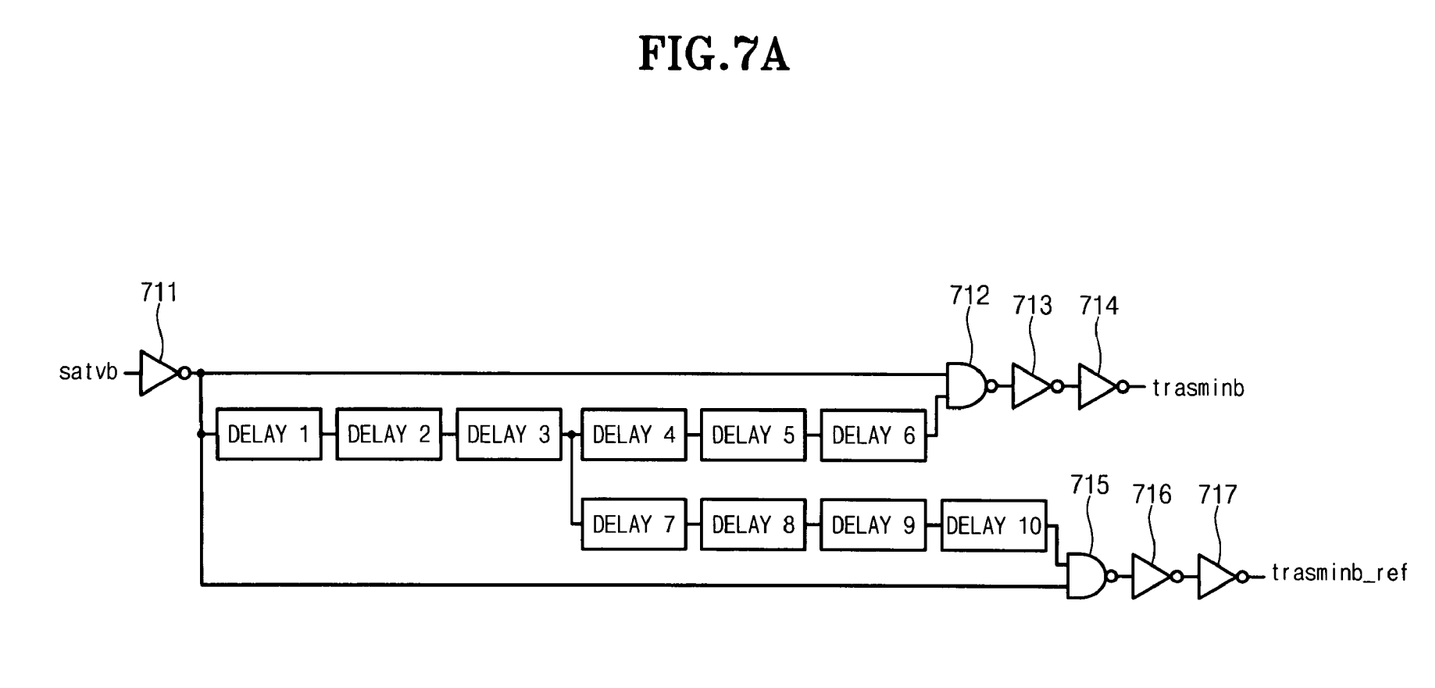
FIG. 7a is a view illustrating a control signal generator according to a first embodiment of the present invention.

FIG. 7a is a view illustrating the control signal generator according to the first embodiment of the present invention.

As illustrated in FIG. 7a, the control signal generator according to the first embodiment of the present invention includes an inverter 711 for receiving a signal satvb, delay units delay 1 to delay 10 for delaying an output signal of the inverter 711, a decoding unit 712 for receiving and decoding the output signal of the inverter 711 and an output signal of the delay unit delay 6, driving units 713 and 714 for driving an output signal of the decoding unit 712, a decoding unit 715 for receiving and decoding the output signal of the inverter 711 and an output signal of the delay unit delay 10, and driving units 716 and 717 for driving an output signal of the decoding unit 715. As illustrated in FIG. 7a, the delay units delay 1 to delay 6 are connected in series, and the delay units delay 1 to delay 3 and delay 7 to delay 10 are connected in series. The decoding units 712 and 715 are composed of NAND gates, and the driving unit 713 and 714 and the driving unit 716 and 717 are composed of pairs of inverters connected in series, respectively. The output signal of the inverter 714 is a signal trasminb, and the output signal of the inverter 717 is a signal trasminb_ref. The signal trasminb is applied to the auto precharge controller in FIG. 6, and the signal trasminb_ref is applied to the refresh controller in FIG. 6.

As illustrated in FIG. 7a, due to the difference between the delay paths, the timing of generation and the pulse widths of the signal trasminb applied to the auto precharge controller and the signal transminb_ref applied to the refresh controller can be adjusted.

Figure 7B:
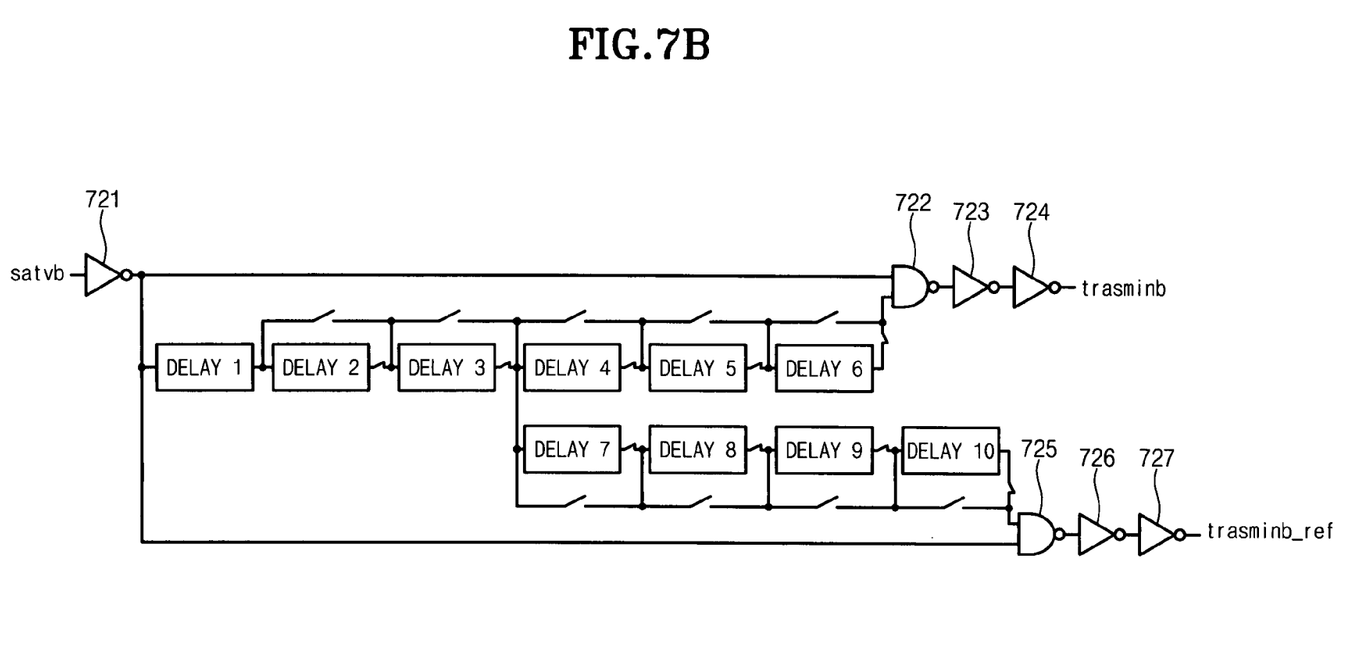
FIG. 7b is a view illustrating a control signal generator according to a second embodiment of the present invention.

FIG. 7b is a view illustrating the control signal generator according to the second embodiment of the present invention. In the second embodiment as illustrated in FIG. 7b, delay times of the respective delay units illustrated in FIG. 7a can be controlled.

As illustrated in FIG. 7b, by adjusting the delay times of the delay units using switches, fuses, etc., the timing of generation and the pulse widths of the signal trasminb applied to the auto precharge controller and the signal trasminb_ref applied to the refresh controller can be adjusted.

Figure 8:
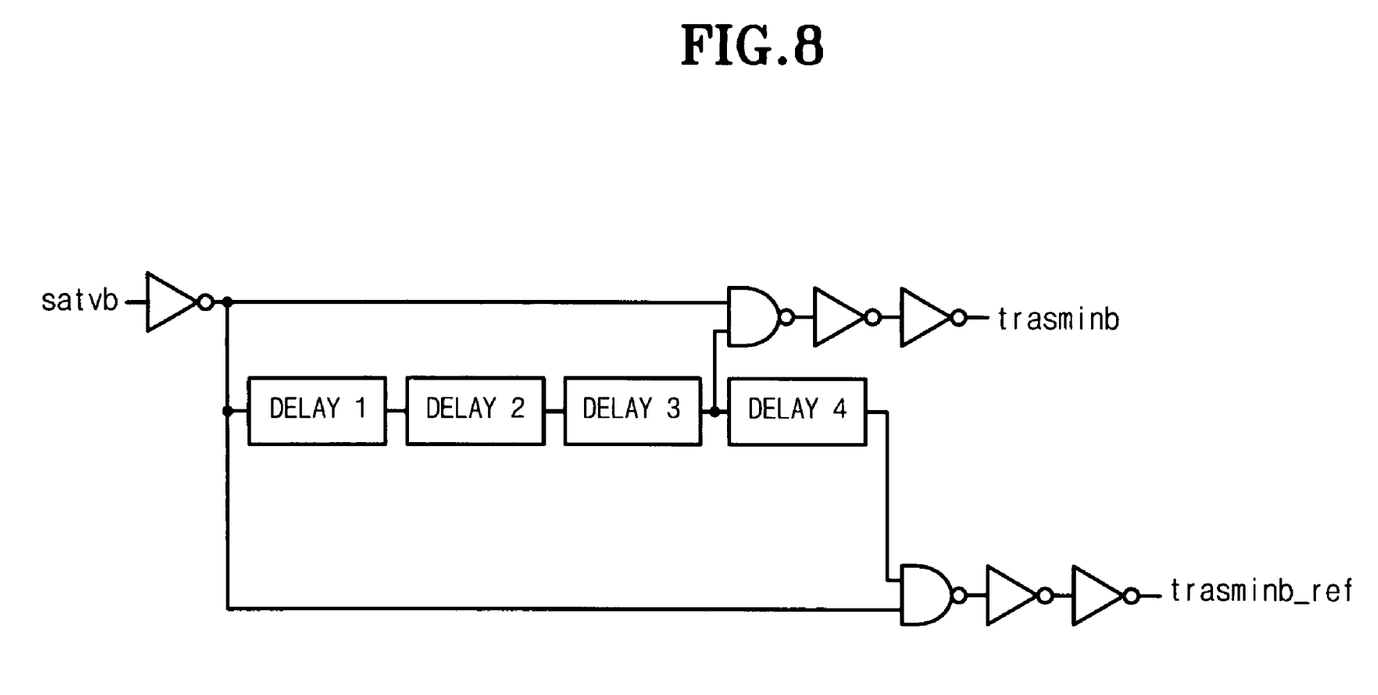
FIG. 8 is a view illustrating a control signal generator according to a third embodiment of the present invention.

FIG. 8 is a view illustrating the control signal generator according to the third embodiment of the present invention.

The delay units of FIG. 8 according to the third embodiment are slightly different from those in other embodiments, but its basic structure is equal to those in FIGS. 7a and 7b.

As illustrated in FIG. 8, the delay times of the delay units delay 1 to delay 3 affect all the signals trasminb and trasminb_ref, but the delay time of the delay unit delay4 affects the signal trasminb_ref only. Accordingly, by adjusting the delay time of the delay unit delay 4, the timing of generation and the pulse width of the signal trasminb_ref can be adjusted.

Figure 9:
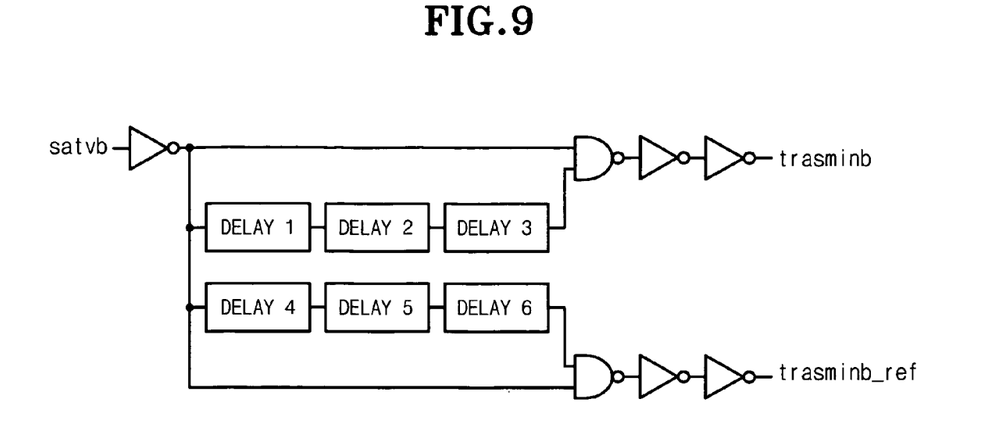
FIG. 9 is a view illustrating a control signal generator according to a fourth embodiment of the present invention.

FIG. 9 is a view illustrating the control signal generator according to the fourth embodiment of the present invention.

The delay units of FIG. 9 according to the fourth embodiment are slightly different from those in other embodiments, but its basic structure is equal to those in FIGS. 7a and 7b and 8.

As illustrated in FIG. 9, the delay times of delay units delay 1 to delay 3 affect the signal trasminb only, and the delay times of the delay units delay 4 to delay 6 affect the signal trasminb_ref only. Accordingly, the timing of generation and the pulse widths of the signals trasminb and trasminb_ref can independently be adjusted.

The delay times of the respective delay units of FIGS. 8 and 9 can be adjusted using switches, fuses, etc., as illustrated in FIG. 7b.

FIGS. 10a to 10c are waveform diagrams of signals according to operation modes according to embodiments of the present invention.

As described above, the signal satvb is shifted from a high-level state to a low-level state if the signal for indicating the active operation is applied, and then shifted to a high-level state if the signal for indicating the precharge operation is applied. In the refresh mode, since if the signal arefp for indicating the refresh operation is activated, the word line is enabled, the signal satvb is activated as a low-level signal if the signal arefp is activated.

The signal trasminb is enabled as a low-level signal when a predetermined time elapses after the signal for activating the word line is applied. The signal trasminb keeps the word line in an active state for the predetermined time tRAS, and secures the time until the word line is turned off thereafter.

The signal trasminb_ref has the same function as the signal trasminb except that the signal trasminb_ref is used in the refresh operation.

The signal with_apcgpb becomes a low-level pulse when a command for requiring the auto precharge operation such as the read with an auto precharge or write with an auto precharge is applied from the outside.

The signal apcg is an internal precharge command for the auto precharge operation.

The signal rpcg is a signal for actually effecting the precharge operation by combining all the cases for the precharge operation.

Lastly, the signal arefp in FIG. 10c is a pulse signal that indicates the auto refresh mode.

FIG. 10a shows the case that the signal with_apcgb is activated as a low-level signal if the read with auto precharge signal or the write with auto precharge signal is applied before the signal trasminb is shifted to a low-level state after the active command is applied. In this case, the precharge signal is not generated during a high-level period of the signal trasminb irrespective of the activation of the signal with_apcgb, and the signal apcg is activated at the timing when the signal trasminb is shifted to a high-level state. Then, the signal rpcg is activated by the signal apcg. If the signal rpcg is activated, the precharge is performed.

FIG. 10b shows the case that the signal with_apcgb is activated as a low-level signal if the read with auto precharge signal or the write with auto precharge signal is applied after the signal trasminb is shifted to a low-level state after the active command is applied. The signal apcg is activated at the moment that the signal with_apcgb is activated. Then, the signal rpcg is activated by the signal apcg. If the signal rpcg is activated, the precharge is performed.

FIG. 10c shows the waveforms of the auto-refresh and self-refresh signals. Since the word line is activated as a high-level signal by the signal arefp, the signal satvb is shifted to a low-level state by the signal arefp. Thereafter, the signal sadly becomes a high-level pulse using the signal trasminb_ref, and this is reflected in the signal rpcg to perform the precharge operation.

As can be seen from FIGS. 10a to 10c, the precharge is performed by the signal trasminb during the auto precharge operation, and the precharge is performed by the signal trasminb_ref during the refresh operation. Accordingly, in the present invention, the circuit can be designed so that the word line has a proper activation time according to the respective operation modes.

Except for the control signal generator proposed according to the present invention, the remaining constituent elements explained in detail with reference to FIG. 1 can be applied to the circuit according to the present invention in the same manner. That is, the circuit of FIG. 1 and the circuits of FIGS. 3 to 5 can be applied to the present invention in the same manner.

As described above, the present invention provides a circuit that generates a plurality of signals capable of adjusting the precharge timing to be different from each other in the respective operation modes, and thus can solve the problems involved in the conventional circuit in that only one signal is provided to adjust the precharge time during the auto-precharge operation and the precharge operation by the refrech, and thus it is impossible to set different precharge times. According to the present invention, there is no loss in the tRC characteristic, and a sufficient time for restoring the data can be secured during the refresh operation.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method for controlling a precharge timing of a memory device, comprising the steps of: generating first and second pulse signals for controlling a precharge operation; receiving the first pulse signal and generating a third pulse signal in a normal operation while receiving the second pulse signal and generating a fourth pulse signal in a refresh operation; and receiving the third and fourth pulse signals and outputting a precharge signal for controlling a precharge timing of the memory device, wherein timing of generation of the first and second pulse signals and pulse widths of the first and second pulse signals are determined to be different from each other, respectively.

2. A method for controlling a precharge timing of a memory device, comprising the steps of: generating first and second pulse signals for controlling a precharge operation; receiving the first pulse signal and generating a third pulse signal in a normal operation while receiving the second pulse signal and generating a fourth pulse signal in a refresh operation; and receiving the third and fourth pulse signals and outputting a precharge signal for controlling a precharge timing of the memory device, wherein the first and second pulse signals are enabled after an active command is generated, and disabled after the precharge signal is generated.

3. The method as claimed in claim 2, wherein if a precharge mode signal for performing an operation by means of a read with an auto precharge command or a write with an auto precharge command is enabled earlier than the first pulse signal in the normal operation, the third pulse signal is enabled in response to the first pulse signal only; and wherein if a precharge mode signal for performing a read with an auto precharge operation or a write with an auto precharge operation is generated after the first pulse signal is enabled in the normal operation, the third pulse signal is enabled in response to the precharge signal only.

4. An apparatus for controlling a precharge timing of a memory device, comprising: a control signal generator for generating first and second pulse signals for controlling a precharge operation; an auto precharge controller for receiving the first signal and operating in a normal operation; a refresh controller for receiving the second signal and operating in a refresh operation; and a precharge pulse generator for outputting a signal for determining a precharge timing of the memory device in response to an output signal of the auto precharge controller or an output signal of the refresh controller, wherein timing of generation of the first and second pulse signals and pulse widths of the first and second pulse signals are determined to be different from each other, respectively.

5. An apparatus for controlling a precharge timing of a memory device, comprising: a control signal generator for generating first and second pulse signals for controlling a precharge operation; an auto precharge controller for receiving the first signal and operating in a normal operation; a refresh controller for receiving the second signal and operating in a refresh operation; and a precharge pulse generator for outputting a signal for determining a precharge timing of the memory device in response to an output signal of the auto precharge controller or an output signal of the refresh controller, wherein the control signal generator comprises: first and second delay units having delay times different from each other; and first and second decoding units for decoding output signals of the first and second delay units, respectively; wherein the control signal generator receives an initial operation signal that is enabled by an active command, the initial operation signal is output as the first pulse signal through the first delay unit and the first decoding unit, and the initial operation signal is output as the second pulse signal through the second delay unit and the second decoding unit.

6. The apparatus as claimed in claim 5, wherein the initial operation signal is disabled in response to the output signal of the precharge pulse generator.

* * * * *